United States Patent [19]

Kohler

[11] 4,074,193

[45] Feb. 14, 1978

[54] COMBINED CURRENT AND VOLTAGE MEASURING APPARATUS

[75] Inventor: Werner Kohler, Bentfeld, Holstein, Germany

[73] Assignee: Siemens Aktiengesellschaft, Munich, Germany

[21] Appl. No.: 523,851

[22] Filed: Nov. 14, 1974

[30] Foreign Application Priority Data

Dec. 20, 1973 Germany .............................. 2363933

[51] Int. Cl.[2] ......................... G01R 1/20; G01R 19/00

[52] U.S. Cl. ..................................... 324/126; 174/143; 324/127; 324/133

[58] Field of Search ................... 324/123 R, 126, 127, 324/133, 99 R; 174/11 BH, 142, 143

[56] References Cited

U.S. PATENT DOCUMENTS

| | | | |
|---|---|---|---|
| 2,724,821 | 11/1955 | Schweitzer, Jr. | 324/127 |
| 3,372,333 | 3/1968 | Esch | 324/99 R |
| 3,396,339 | 8/1968 | Miram | 174/143 |
| 3,524,133 | 8/1970 | Arndt | 324/126 |
| 3,715,742 | 2/1973 | Schweitzer, Jr. | 324/133 |
| 3,746,935 | 7/1973 | Wagenaar et al. | 174/11 BH |

FOREIGN PATENT DOCUMENTS

| | | | |
|---|---|---|---|
| 1,114,921 | 10/1961 | Germany | 324/126 |

*Primary Examiner*—Rudolph V. Rolinec
*Assistant Examiner*—Ernest F. Karlsen
*Attorney, Agent, or Firm*—Kenyon & Kenyon, Reilly, Carr & Chapin

[57] ABSTRACT

A combined current and voltage measuring apparatus for measuring voltage and current on a rod-shaped primary conductor for conducting current at an upper potential includes a cast resin body wherein there is embedded the sensor of a current measuring unit. The case resin body is arranged in surrounding relation to the primary conductor and, in addition to carrying the sensor, it is also utilized as dielectric for the upper potential capacitor of a voltage divider which supplies the amplifier of a capacitive voltage measuring unit. Embedded in the cast resin body is a cylindrical electrode which forms with the rod-shaped primary conductor extending through the electrode the capacitor on the high-voltage side of the capacitive voltage divider. The sensor of the current measuring unit contains a winding without a ferrous core which surrounds the outside of the cylindrical electrode.

7 Claims, 1 Drawing Figure

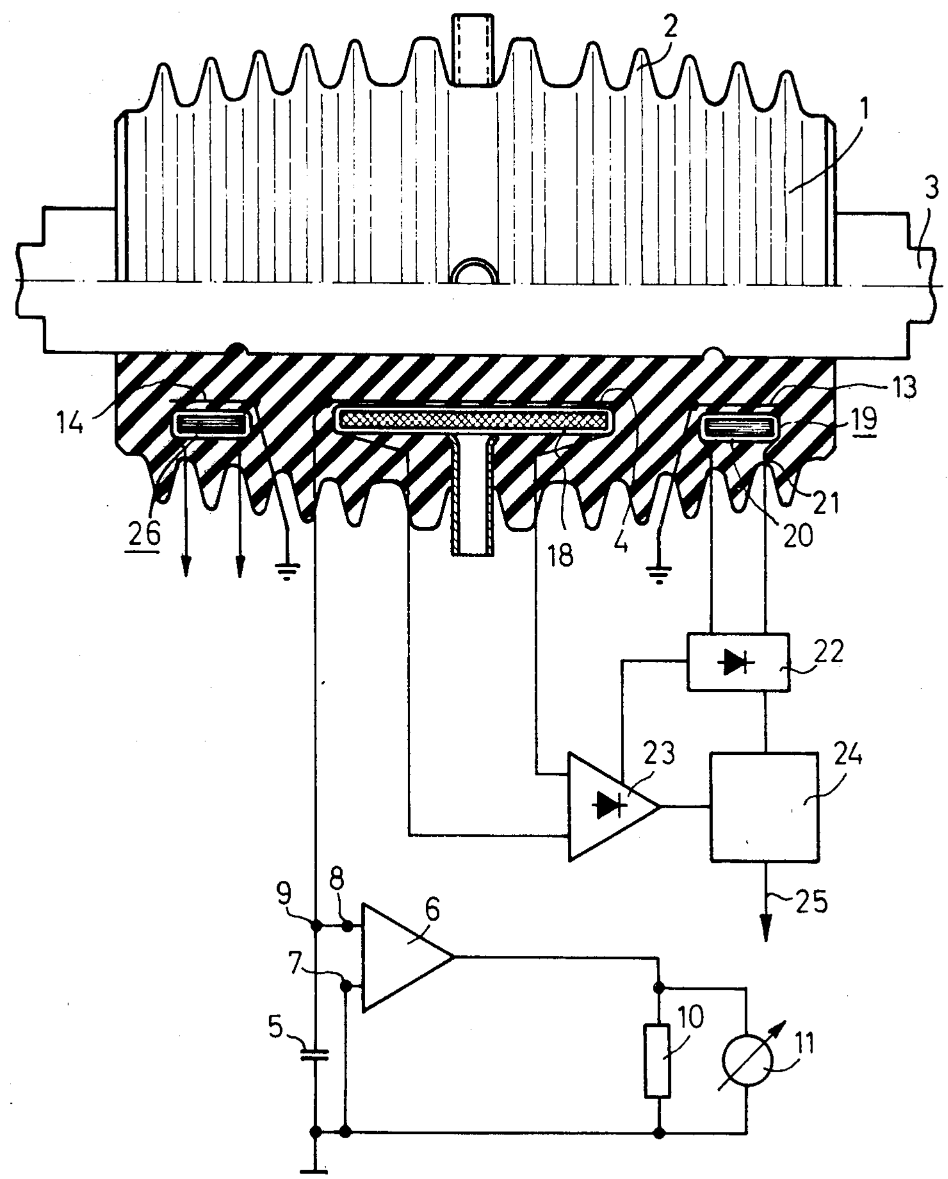
2
1
3
14
13
19
26
21
20
18
4
22
23
24
25
9
8
6
7
5
10
11

COMBINED CURRENT AND VOLTAGE MEASURING APPARATUS

BACKGROUND OF THE INVENTION

The invention relates to a combined current and voltage measuring apparatus with a cast resin body which supports the current measuring unit and is also utilized as dielectric for the capacitor on the high-voltage side of the capacitive voltage divider equipped with an amplifier of a capacitive measuring unit. The cast resin body is penetrated by the primary conductor carrying the current to be measured.

A combined current and voltage transformer is known from Deutsche Auslegeschrift No. 1,114,921 wherein the voltage transformer unit contains a capacitive transformer. The dielectric of the winding insulation of the current transformer unit is also utilized as dielectric for the capacitor on the high-voltage side of the capacitive divider in that there are applied to the winding insulation conducting coatings forming the electrodes of the high-voltage capacitor.

The construction of this known combined current and voltage transformer leaves something to be desired inasmuch as it is relatively bulky; this is attributable to the fact that a relatively large current measuring unit in the form of a secondary winding with iron core is used which leads, in turn, to a correspondingly large cast resin body. This causes relatively high production costs and imparts a comparatively high weight to the known combination transformer on the one hand, and two coatings further increase cost on the other.

Accordingly, it is an object of the invention to provide a combined current and voltage measuring apparatus which affords a production cost advantage as well as an advantage in structural size when compared to the above-mentioned arrangement.

SUMMARY OF THE INVENTION

The combined current and voltage measuring apparatus according to the invention realizes the above object by including as a feature a body of cast resin wherein there is embedded a cylindrical electrode arranged in spaced relation to a rod-shaped primary conductor. The cylindrical electrode and the primary conductor conjointly define the capacitor on the high-voltage side of a capacitive voltage divider. According to a further feature of the invention, the current measuring unit contains a sensor including a winding without ferrous core; this winding surrounds the outside of the cylindrical electrode.

The combined current and voltage measuring apparatus according to the invention offers the advantage, first of all, that it makes possible a high-voltage capacitor which uses only one single cylindrical electrode embedded in the cast resin body because the other electrode of the high-voltage capacitor is formed by the primary conductor carrying the current to be measured. The cylindrical electrode also performs the function of contributing to an equalization of the potential stress on the cast resin body between the high-voltage conductor and the coreless winding so that, because the cylindrical electrode is utilized, the cast resin body may also be of relatively thin configuration. This results in a relatively compact shape of the cast resin body and in a saving of cast resin. Adding to these advantageous properties of the combined current and voltage measuring apparatus according to the invention, moreover, is the fact that the current measuring unit includes a winding without ferrous core; this winding, due to the absence of an iron core, facilitates making the entire device compact. In addition, the occurrence of saturation phenomena and, hence, a greater transformation error in the event of excess currents is avoided by the use of the coreless coil.

While it is already known from German Pat. No. 716,374 how to obtain an arrangement for the capacitive measurement of voltage by having the feed-through bolt of a single conductor current transformer surrounded, in the vicinity of the mounting, by a cylindrical metal shield, it is however, not evident from this patent how to arrange this metal shield and, further, it is not evident that this cylindrical metal shield also contributes to relieving the insulation because the secondary winding of the current transformer is disposed outside of the cylindrical metal shield as is the case in the measuring apparatus according to the invention. The known single conductor current transformer obviously involves a transformer wherein an iron core supporting the secondary winding is employed to obtain the secondary quantity, and not a winding without ferrous core as in the measuring apparatus according to the invention.

Deutsche Offenlegungsschrift 2,125,297 discloses a voltage transformer which includes a capacitive voltage divider with a succeeding amplifier. The capacitor on the high-voltage side of the capacitive voltage divider is formed by a currentcarrying conductor and a cylindrical tube surrounding it; however, this known voltage transformer involves a transformer for fully insulated, metal-encapsulated high-voltage switch gear wherein the insulating gas contained in the switch gear serves as dielectric for the high-voltage capacitor. Insofar as a cast resin body is provided in the known voltage transformer, it serves the purpose of supporting a coating forming the cylindrical electrode and, if required, the accommodation of the iron core with secondary winding of a current transformer unit.

As already mentioned above, the arrangement of the cylindrical electrode in the combined current and voltage measuring apparatus according to the invention is such as to contribute to an equalization of the potential stress on the region of the cast resin body between the primary conductor and the coreless winding; therefore, it is advantageous to arrange the cylindrical electrode so as to have a potential close to ground potential.

Embedded next to the cylindrical electrode in the cast resin body on both sides are protective annular electrodes having a beneficial effect on the course of the electric field between the cylindrical electrode and the primary conductor and also contributing to the equalization of the electrical stress on the cast resin body.

In a preferred embodiment of the measuring apparatus according to the invention, there is at least one iron core with applied winding which surrounds one of the protective annular electrodes on its side facing away from the primary conductor and which forms a saturation current transformer with the primary conductor. The ends of the coreless winding are connected to the input of a further amplifier having an operating voltage furnished by the winding of the saturation current transformer. Such a configuration of the measuring apparatus according to the invention achieves independence of the current measuring unit from an additional operating voltage source. But basically, it is also possible to operate the measuring apparatus according to the invention without a saturation current transformer by resorting to operating voltage source which must be made available and will, as a rule, be available anyway to supply the amplifier of the voltage measuring unit. In such a case, there will only be a greater load on the operating voltage source, which may be disagreeable, particularly when the operating voltage source consists of batteries.

Basically, the device with the winding equipped iron core may be arranged in various ways; for example, the device may be mounted on the cast resin body. But it is advantageous, if only for protection against damage, if the device with the winding equipped iron core is embedded in the cast resin body as is the coreless winding.

The amplifier of the apparatus according to the invention, preferably fed by the saturation current transformer, may be followed directly by an electronic protective device or an appropriate counter. If long-range transmission of the secondary quantity supplied by the current measuring unit is desired, it is advantageous to have a voltage-frequency converter follow the other amplifier.

Although the invention is illustrated and described herein as a combined current and voltage measuring apparatus, it is nevertheless not intended to be limited to the details shown, since various modifications may be made therein within the scope and the range of the claims. The invention, however, together with additional objects and advantages will be best understood from the following description and in connection with the accompanying drawing.

BRIEF DESCRIPTION OF THE DRAWING

The DRAWING is a schematic diagram, partially in section, of a combined current and voltage measuring apparatus according to the invention. The ancillary electronic equipment required according to a subsidiary embodiment of the invention for furnishing measuring voltages is also shown schematically in the drawing.

DESCRIPTION OF THE PREFERRED EMBODIMENTS OF THE INVENTION

The current and voltage measuring apparatus according to the invention contains a body 1 of casting resin which is provided with ribs 2 to lengthen the surface leakage path. The casting resin body 1 is penetrated by a primary conductor 3 to which the voltage to be measured is applied and which carries the current to be measured.

Embedded in the casting resin body 1 is a cylindrical electrode 4 which forms, with the primary conductor 3, the capacitor on the high-voltage side of a capacitive voltage divider, the low-voltage capacitor 5 of the divider being disposed outside of the casting resin body 1. The capacitive voltage divider is followed by an amplifier 6, one input 7 of which is grounded; the other input 8 of the amplifier 6 is connected to the terminal 9 of the low-voltage capacitor 5 opposite from ground. A resistor 10 is connected to the amplifier 6. A voltmeter 11, from which can be read a voltage proportional to the voltage of the primary conductor 3, is connected parallel to the resistor 10.

In addition to the cylindrical electrode 4, the casting resin body 1 of the combination current and voltage measuring apparatus according to the invention contains a current measuring unit comprising a winding 18 without ferrous core and at least one device 19 which contains an iron core 20 with winding 21. The device 19 with iron core 20 and winding 21, disposed outside of a protective annular electrode 13, together with the primary conductor 3, forms a saturation current transformer. By utilizing a rectifier 22 connected to the winding 21, the device 19 assures that an amplifier 23 connected to the ends of the coreless winding 18 can be supplied with operating energy. The amplifier 23 then furnishes a voltage which is a measure of the current in the conductor 3 and which, if applicable, can be processed further in an electronic protective device. If long-range transmission of the output voltage of the amplifier 23 is desired, it is expedient to have the amplifier 23 followed by an analog-digital converter 24 which furnishes at its output 25 a frequency proportional to the current in the primary conductor 3 when a voltage-frequency converter is utilized.

To assure that the amplifier 23 and, if applicable, the analog-digital converter 24, are supplied with current also when the currents in the primary conductor 3 are small, several devices with iron core and winding may be provided, each such device forming a saturation current transformer with the primary conductor 3. Only one such additional device 26 is shown in the drawing and is disposed outside another protective annular electrode 14. At small currents in the primary conductor 3 it is expedient to connect this device 26 in series with the device 19 and, if applicable, other devices, it being possible to use electronic switches (not shown) for this series arrangement.

What is claimed is:

1. A combined current and voltage measuring apparatus for measuring voltage and current on a rod-like primary conductor for conducting current at an upper potential comprising: a capacitive voltage divider having upper and lower potential capacitors and extending between the upper potential and a lower potential; a body of cast resin disposed in surrounding relation to the primary conductor; a cylindrical electrode embedded in said body so as to cause the primary conductor to extend through said electrode in spaced relation to the same, said electrode and the primary conductor conjointly defining said upper potential capacitor of said voltage divider and the portion of cast resin of said body between said electrode and the primary conductor constituting the dielectric of said upper potential capacitor; and, a coreless winding carried by said body of cast resin for sensing the current in the primary conductor, said winding being arranged in surrounding relation to said cylindrical electrode so as to cause said cylindrical electrode to equalize the potential stress on said cast resin body between the primary conductor and said coreless winding.

2. The apparatus of claim 1 comprising an amplifier connected to said lower potential capacitor of said capacitive voltage divider to conjointly define with said capacitive voltage divider a capacitive voltage measuring unit for supplying a voltage proportional to the voltage on the primary conductor.

3. The apparatus of claim 2 wherein said lower potential is earth potential, said capacitive voltage divider being configured so as to place said electrode at a potential close to said earth potential.

4. The apparatus of claim 2 comprising grounded protective ring electrodes embedded in said cast resin body and disposed on respective sides of said cylindrical electrode.

5. A combined current and voltage measuring apparatus for measuring voltage and current on a rod-like primary conductor for conducting current at an upper potential comprising: a capacitive voltage divider having upper and lower potential capacitors and extending between the upper potential and a lower potential; a body of cast resin disposed in surrounding relation to the primary conductor; a cylindrical electrode embedded in said body so as to cause the primary conductor to extend through said electrode in spaced relation to the same, said electrode and the primary conductor conjointly defining said upper potential capacitor of said voltage divider and the portion of cast resin of said body between said electrode and the primary conductor constituting the dielectric of said upper potential capacitor; a coreless winding carried by said body of cast resin for sensing the current in the primary conductor, said winding being arranged in surrounding relation to said cylindrical electrode so as to cause said cylindrical electrode to equalize the potential stress on said cast resin body between the primary conductor and said coreless winding; an amplifier connected to said lower potential capacitor of said capacitive voltage divider to conjointly define with said capacitive voltage divider a capacitive voltage measuring unit for supplying a voltage proportional to the voltage on the primary conductor; ground protective ring electrodes embedded in said cast resin body and disposed on respective sides of said cylindrical electrode; a further amplifier having input terminals connected to said coreless winding whereby said further amplifier supplies an electrical quantity proportional to the current conducted by the primary conductor; and a supply arrangement including: a wound member made up of an iron core having a winding wound thereon; said wound member being disposed in surrounding relation to one of said protective ring electrodes on the side of said one ring electrode facing away from the primary conductor, said wound member and the primary conductor conjointly defining a saturation current transformer for supplying an operational voltage to said further amplifier.

6. The apparatus of claim 5, said wound member being embedded in said cast resin body.

7. The apparatus of claim 5 comprising a voltagefrequency converter connected to the output of said further amplifier.

* * * * *